United States Patent
Plachta et al.

(10) Patent No.: US 7,283,072 B1
(45) Date of Patent: Oct. 16, 2007

(54) METHODS OF CREATING A DICTIONARY FOR DATA COMPRESSION

(75) Inventors: Piotr M. Plachta, Toronto (CA); Wolfram Sauer, Austin, TX (US); Balakrishna Raghavendra Iyer, San Jose, CA (US); Steven Wayne White, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/278,118

(22) Filed: Mar. 30, 2006

(51) Int. Cl.
*H03M 7/00* (2006.01)

(52) U.S. Cl. ......................... 341/107; 341/87
(58) Field of Classification Search .................. 341/50, 341/51, 60, 63, 65, 106, 107, 87
See application file for complete search history.

(56) References Cited

U.S. PATENT DOCUMENTS

| | | | | |
|---|---|---|---|---|
| 5,151,697 A | * | 9/1992 | Bunton | 341/51 |
| 5,936,560 A | * | 8/1999 | Higuchi | 341/106 |
| 6,657,564 B2 | * | 12/2003 | Malik | 341/51 |
| 7,164,370 B1 | * | 1/2007 | Mishra | 341/51 |

* cited by examiner

*Primary Examiner*—Brian Young
(74) *Attorney, Agent, or Firm*—Sughrue Mion, PLLC

(57) ABSTRACT

Some aspects of the invention provide methods, systems, and computer program products for creating a static dictionary in which longer byte-strings are preferred. To that end, in accordance with aspects of the present invention, a new heuristic is defined to replace the aforementioned frequency count metric used to record the number of times a particular node in a data tree is visited. The new heuristic is based on counting the number of times an end-node of a particular byte-string is visited, while not incrementing a count for nodes storing characters in the middle of the byte-string as often as each time such nodes are visited. The result is an occurrence count metric that favours longer byte-strings, by being biased towards not incrementing the respective occurrence count values for nodes storing characters in the middle of a byte-string.

17 Claims, 7 Drawing Sheets

22 {...AbAl...Abs...Abi...Ali...Alt

| Symbol | Pointer | Character-String |
|---|---|---|
| 0 | | |
| ⋮ | ⋮ | ⋮ |
| 65 | 210 | A |
| ⋮ | ⋮ | ⋮ |
| 257 | 220 | Ab |
| 258 | 230 | Al |
| ⋮ | ⋮ | ⋮ |
| 261 | 222 | Abs |
| ⋮ | ⋮ | ⋮ |
| 270 | 224 | Abi |
| ⋮ | ⋮ | ⋮ |
| 280 | 232 | Ali |
| ⋮ | ⋮ | ⋮ |
| 290 | 234 | Alt |
| ⋮ | | ⋮ |
| 4095 | | |

METHODS OF CREATING A DICTIONARY FOR DATA COMPRESSION

FIELD OF THE INVENTION

The invention relates to data compression and, in particular, to methods, systems, and computer program products for creating a dictionary for use in data compression and expansion.

BACKGROUND OF THE INVENTION

Data compression methods can be divided into two broad categories: namely, "lossy" and lossless data compression methods. Lossy data compression methods result in a loss of some information during compression. On the other hand, lossless data compression refers to the ability to change a data set, without losing information, so that the data set can be stored within less space after compression as compared to before compression. Lossy compression methods are often employed in situations where a loss of information is tolerable (e.g. compression of audio and video data). By contrast, lossless compression methods are preferably employed in situations where a loss of information is undesirable and fidelity is a priority (e.g. compression of text files in a database).

Lossless data compression methods—as particularly applied in database systems storing text information—help to reduce capital and operating costs. A typical database system has a finite amount of storage (e.g. memory, disk space and the like). As the amount of information in a database increases, new allocations of storage may be required. However, adding and maintaining additional blocks of memory adds capital and operating costs. In the context of large database systems, such as those employed in the financial services sector, such capital and operating cost increases can make database management very expensive. Accordingly, compressing data is a useful way of utilizing available storage and limiting requirements for new allocations of storage.

A particular subset of lossless data compression methods, referred to hereinafter as binary-string/symbol substitution methods, have been developed that exploit the redundancy of byte-strings repeated within a text file. Compression is accomplished by replacing frequently occurring byte-strings with shorter identifiers/placeholders, referred to hereinafter as symbols. The Lempel-Ziv 1978 (LZ78) method of data compression is at the root of this class of binary-string/symbol substitution methods. In accordance with the LZ78 method: a static dictionary is created that contains frequently occurring byte-strings and corresponding symbols; and, compression is accomplished by replacing frequently occurring byte-strings with respective symbols (i.e. exchanging text-symbol pairs).

A number of criteria are considered when evaluating the performance of a compression method, such as for example, computational overhead, efficiency and compression ratio. As a general rule, for compression to be considered effective, the storage allocation for the combination of a static dictionary and a respective compressed data set should be substantially smaller than that for the corresponding uncompressed data set. To that end, a static dictionary is typically defined as having a fixed and limited size, which in turn means that only the most frequently occurring byte-strings are stored in accordance with known methods of creating a static dictionary. However, there are a number of problems associated with this.

The most frequently occurring byte-strings are typically quite short, which means that the longest byte-strings that could be used may not be stored for use in the static dictionary since the dictionary is biased towards retaining shorter more frequently occurring byte-strings. Yet, during the actual compression process byte-strings in the data set are matched to the longest byte-strings stored in the static dictionary. Subsequently, the static dictionary contains a number of short byte-strings that are rarely used, and the resultant compression ratio of the compression process may be reduced because the longest byte-strings that could be matched may not be stored in the static dictionary for use during the compression process.

SUMMARY OF THE INVENTION

A preferred embodiment of the invention is directed to a method for creating a static dictionary, the method comprising: providing a plurality of data trees, each of the plurality of data trees comprising a root node, at least one of the plurality of data trees comprising at least one child node, wherein each root node and each child node stores an associated binary pattern, wherein each child node is adapted to store a symbol associated with the child node and an occurrence count value associated with the child node; defining a binary pattern string, the binary pattern string comprising a concatenation of the binary patterns in a direct path from the root node to a particular child node, and wherein an occurrence count value for the binary pattern string is the occurrence count value of the particular child node; and, incrementing the occurrence count value of the binary pattern string when the particular child node is visited.

In accordance with some aspects of the invention, the method also includes storing the respective unique symbols and corresponding pointers to particular child nodes in a symbol table.

In accordance with some aspects of the invention, the method also includes: adding child nodes to the plurality of data trees until the combined size of the plurality of the data trees is a predetermined temporary maximum size; and removing binary pattern strings using an evaluation of occurrence count values so as to reduce the combined size of the plurality of data trees down to a predetermined size.

In accordance with some aspects of the invention, incrementing the occurrence count value of a particular child node occurs only when the particular child node becomes a parent node to a new child node added to the static dictionary.

In accordance with some aspects of the invention, incrementing the occurrence count value of a particular child node occurs only when the particular child node is visited and the particular child node does not serve as a parent node to any other child nodes.

In accordance with some aspects of the invention, the predetermined size is one of a predetermined temporary pruned size and a predetermined desired final size.

In accordance with some aspects of the invention, removing binary pattern strings using an evaluation of occurrence count values comprises: identifying binary pattern strings with low occurrence count values; and, deleting at least some of the child nodes included in the binary pattern string.

In accordance with some aspects of the invention, removing binary pattern strings using an evaluation of occurrence count values comprises: identifying binary pattern strings with low efficiency values, wherein the efficiency value of a binary string is the occurrence count of the binary pattern string multiplied by the length of the binary pattern string; and, deleting at least some of the child nodes included in the binary pattern string.

In accordance with some aspects of the invention, the method further comprises: constructing a sample of the data set using the representative of the content of the data set; storing the sample in a buffer; and, performing a sample compression by matching binary pattern strings in the buffer to binary pattern strings in the static dictionary to determine the occurrence count values of binary string patterns in the static dictionary.

In accordance with some aspects of the invention, the method comprises: identifying a non-branching sequential string of child nodes with low occurrence count values; and, replacing the non-branching sequential string of child nodes with a single child node storing the corresponding binary patterns from the non-branching sequential string of nodes.

According to a further embodiment of the invention, there is provided a system comprising: an element for providing a plurality of data trees, each of the plurality of data trees comprising a root node, at least one of the plurality of data trees comprising at least one child node, wherein each root node and each child node stores an associated binary pattern, wherein each child node is adapted to store a symbol associated with the child node and an occurrence count value associated with the child node; an element for defining a binary pattern string, the binary pattern string comprising a concatenation of the binary patterns in a direct path from the root node to a particular child node, and wherein an occurrence count value for the binary pattern string is the occurrence count value of the particular child node; and an element for incrementing the occurrence count value of the binary pattern string when the particular child node is visited.

In accordance with some aspects of the invention, the system further comprises an element for storing the respective unique symbols and corresponding pointers to particular child nodes in a symbol table.

In accordance with some aspects of the invention, the system further comprises an element for adding child nodes to the plurality of data trees until the combined size of the plurality of the data trees is a predetermined temporary maximum size; and an element for removing binary pattern strings using an evaluation of occurrence count values so as to reduce the combined size of the plurality of data trees down to a predetermined size.

According to a further embodiment of the invention, there is provided a computer program product comprising a computer usable medium including computer usable program code for creating a static dictionary for use in lossless data compression and expansion, the computer program product including: computer usable program code for providing a plurality of data trees, each of the plurality of data trees comprising a root node, at least one of the plurality of data trees comprising at least one child node, wherein each root node and each child node stores an associated binary pattern, wherein each child node is adapted to store a symbol associated with the child node and an occurrence count value associated with the child node; computer usable program code for defining a binary pattern string, the binary pattern string comprising a concatenation of the binary patterns in a direct path from the root node to a particular child node, and wherein an occurrence count value for the binary pattern string is the occurrence count value of the particular child node; and, computer usable program code for incrementing the occurrence count value of the binary pattern string when the particular child node is visited.

In accordance with some aspects of the invention, the computer program product also includes computer usable program for storing the respective unique symbols and corresponding pointers to particular child nodes in a symbol table.

In accordance with some aspects of the invention, the computer program product also includes: computer usable program code for adding child nodes to the plurality of data trees until the combined size of the plurality of the data trees is a predetermined temporary maximum size; and, computer usable program code for removing binary pattern strings using an evaluation of occurrence count values so as to reduce the combined size of the plurality of data trees down to a predetermined size.

In accordance with some aspects of the invention, the computer program product also includes computer usable program code for incrementing the occurrence count value of a particular child node occurs only when the particular child node becomes a parent node to a new child node added to the static dictionary.

In accordance with some aspects of the invention, the computer program product also includes: computer usable program code for constructing a sample of the data set using the representative of the content of the data set; computer usable program code for storing the sample in a buffer; and, computer usable program code for performing a sample compression by matching binary pattern strings in the buffer to binary pattern strings in the static dictionary to determine the occurrence count values of binary string patterns in the static dictionary.

In accordance with some aspects of the invention, the computer program product also includes: computer usable program code for identifying a non-branching sequential string of child nodes with low occurrence count values; and, computer usable program code for replacing the non-branching sequential string of child nodes with a single child node storing the corresponding binary patterns from the non-branching sequential string of nodes.

Other aspects and features of the present invention will become apparent, to those ordinarily skilled in the art, upon review of the following description of specified embodiments of the invention.

BRIEF DESCRIPTION OF THE DRAWINGS

For a better understanding of the present invention, and to show more clearly how it may be carried into effect, reference will now be made, by way of example, to the accompanying drawings, which illustrate aspects of embodiments of the present invention and in which.

DETAILED DESCRIPTION

Figures 1A, 1B, 1C:
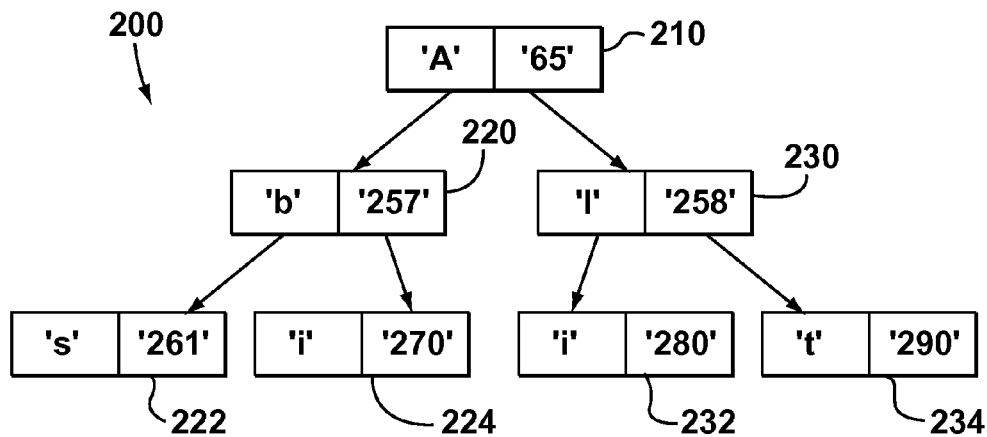
FIG. 1A is a block diagram illustration of an example data tree.
FIG. 1B is an example of a partially shown byte-string in a data set used to create the data tree illustrated in FIG. 1A.
FIG. 1C is an example of a symbol table corresponding to the data tree illustrated in FIG. 1A.

There are a number of problems associated with known methods of creating a static dictionary for use in data compression. For example, there is a bias towards storing short byte-strings in the static dictionary. The bias is the result of at least two factors. The first factor is that a static dictionary is of a limited size. The second is that previously known methods of selecting byte-strings to be stored in the static dictionary rely on a frequency count metric that is often incremented at a higher rate for short byte-strings as compared to long byte-strings. In turn, in many cases short byte-strings will likely have respective frequency count values that are higher than those for longer byte-strings. As a result, the longest byte-strings that could be used may not be stored for use in the static dictionary given the finite size of the static dictionary and the expected multitude short and frequently occurring byte-strings in a data set. Yet, during the actual compression process byte-strings in the data-set are matched to the longest byte-string/symbol pairs in the static dictionary. Subsequently, the static dictionary contains a number of short byte-strings that are rarely used. Moreover, the resultant compression ratio of the compression process may be reduced because the longest byte-strings that could be matched may not be available in the static dictionary.

At least one data tree is often included in a static dictionary. A data tree has a number of nodes that are each used to store a single character from a byte-string. The branching pattern of a data tree defines the relationship between nodes and thus the arrangement of byte-strings stored in the data tree. In accordance with previously known methods of creating a static dictionary, each node storing a character is provided with a respective frequency count value that is incremented each time the node is visited. Accordingly, for a byte-string of arbitrary length the nodes storing characters near the beginning of the byte-string will inherently have a higher frequency count value than those nodes near the end of the byte-string, since the nodes near the beginning must be traversed to reach the nodes near the end. This biases the byte-strings stored in the static dictionary to those represented by nodes having the highest frequency count value. As a result, short byte-strings, often made up of nodes near the beginning of a longer byte-string, are preferred by such methods.

By contrast, embodiments of the present invention provide for methods, systems, and computer program products for creating a static dictionary in which longer byte-strings are preferred. To that end, in accordance with aspects of the present invention, a new heuristic is defined to replace the aforementioned frequency count metric used to record the number of times a particular node in a data tree is visited. The new heuristic is based on counting the number of times an end-node of a particular byte-string is visited, while not incrementing a count for nodes storing characters in the middle of the byte-string as often as each time such nodes are visited. The result is an occurrence count metric that favors longer byte-strings.

According to aspects of the invention, a respective occurrence count for a particular byte-string is tabulated while a static dictionary is being created. An exemplary method of tabulating occurrence count values simultaneously while a static dictionary is being created is described below with reference to FIG. 2.

Additionally and/or alternatively, according to other aspects of the invention the occurrence count values for respective byte-strings are tabulated after at least a portion of the static dictionary is created using a portion of the data set. In some embodiments the portion of the data set used to tabulate occurrence count values is stored in a buffer. An exemplary method of tabulating occurrence count values after at least a portion of a static dictionary is created is described below with reference to FIGS. 3A and 3B.

Additionally and/or alternatively, according to other aspects of the invention, a buffer is provided. The buffer is used for refreshing/re-tabulating occurrence count values for symbols by performing a sample compression using the contents of the buffer. This is done immediately prior to pruning the tree. Sample compression involves zeroing out the occurrence count values of all nodes, then compressing the buffer using the current static dictionary. The resulting compressed data is not retained; only, occurrence count values of nodes used are updated. This refresh will set the occurrence count values of all nodes that are not used to zero, thus possibly making the prune more accurate and possibly increasing the compression ratio.

Additionally and/or alternatively, in accordance with other aspects of the invention a non-branching sequential string of nodes storing characters of a respective byte-string may be replaced with a single node storing the corresponding characters and having only one symbol. By replacing a non-branching sequential string of nodes with a single node the amount of memory allocated for one or more data trees may be reduced and symbols available in a respective symbol table may be used more effectively. In accordance with other aspects of the invention, the last node in a non-branching sequential string of nodes may have multiple child nodes. However, every node preferably has only one parent node. The resulting collapsed path is known as a "one-way street". Two exemplary methods of concatenating a non-branching string of sequential nodes are described below with reference to FIGS. 4A, 4B, 4C and 5.

Aspects of the invention may be embodied in a number of forms. For example, various aspects of the invention can be embodied in a suitable combination of hardware, software and firmware. In particular, some embodiments include, without limitation, entirely hardware, entirely software, entirely firmware or some suitable combination of hardware, software and firmware. In a preferred embodiment, the invention is implemented in software, which includes but is not limited to firmware, resident software, microcode, etc.

Additionally and/or alternatively, aspects of the invention can be embodied in the form of a computer program product accessible from a computer-usable or computer-readable medium providing program code for use by or in connection with a computer or any instruction execution system. For the purposes of this description, a computer-usable or computer readable medium can be any apparatus that can contain, store, communicate, propagate, or transport the program for use by or in connection with the instruction execution system, apparatus, or device.

A computer-readable medium can be an electronic, magnetic, optical, electromagnetic, infrared, or semiconductor system (or apparatus or device) or a propagation medium. Examples of a computer-readable medium include a semiconductor and/or solid-state memory, magnetic tape, a removable computer diskette, a random access memory (RAM), a read-only memory (ROM), a rigid magnetic disk and an optical disk. Current examples of optical disks include, without limitation, compact disk-read only memory (CD-ROM), compact disk-read/write (CD-R/W) and DVD.

In accordance with aspects of the invention, a data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output (i.e. I/O devices)—including but not limited to keyboards, displays, pointing devices, etc.—can be coupled to the system either directly or through intervening I/O controllers.

Network adapters may also be coupled to the system to enable communication between multiple data processing systems, remote printers, or storage devices through intervening private or public networks. Modems, cable modems and Ethernet cards are just a few of the currently available types of network adapters.

In accordance with other aspects of the invention, a static dictionary includes a combination of a collection of one or more data trees and a symbol table. That is, a static dictionary is represented by a trie, which is a collection of multi-child trees in common prefix or common suffix form. The trie maps a byte-string to a symbol. Each data tree stores a respective set of byte-strings. The symbol table stores symbols relating to each byte-string stored in the collection of data trees. A symbol table is not necessary since the tree could always be exhaustively searched to find a given symbol. FIGS. 1A and 1C are illustrative examples of a data tree 200 and a symbol table, created from a partially shown data set 22 provided in FIG. 1B.

A static dictionary is only addressable in a finite amount of space, which means the number of symbols that may be used is limited. Thus, it is beneficial to select the most efficient symbols. In accordance with aspects of the present invention a definition of efficiency is the degree to which compression ratio is improved, while reducing the dictionary size.

Generally, each data tree includes a single root node and possibly one or more child nodes, where each node stores an arbitrary character and a corresponding symbol unique to the node that is also stored in the symbol table. A data tree extends from the root node. That is, a root node serves as a parent node to one or more child nodes storing the same or other characters as the root node. A particular child node may also serve as a parent node to additional child nodes that are lower in the data tree than the particular child node. However, it is preferable that each child node has only one direct parent node. It was noted above that each data tree stores a respective set of byte-strings. More specifically, each data tree is a common-prefix or common-suffix representation of a byte-string. As such, retrieval of a particular byte-string involves concatenating characters encountered on a direct path from the root node to a respective child node storing the last character of the byte-string.

In accordance with other aspects of the invention, each root node stores a unique byte from the Extended ASCII Character Set as a corresponding unique 8-bit binary number. Those skilled in the art will appreciate that there are 256 such unique 8-bit binary numbers in the Extended ASCII Character Set. Thus, in accordance with some aspects of the invention, there may be 256 root nodes for a corresponding set of 256 data trees included in the static dictionary. That is each of the 256 data trees is uniquely identifiable by the character stored in a respective root node. For example, a first root node may store the null character " ", a $65^{th}$ root node may store the character "A" and a $97^{th}$ root node may store the character "a". Those skilled in the art will also appreciate that other character sets (e.g. the complex and simplified Chinese character sets) with more or less than 256 characters may also be used to define root nodes. Those skilled in the art will also appreciate that, while a byte is normally considered a binary pattern of 8-bits, aspects of the invention allow for different numbers of bits to be considered for the definition of characters and other types of information. As such, although aspects of the present invention are described below with respect to bytes, those skilled in the art will appreciate that a "byte" is interchangeable with a "binary pattern" of any length, which in turn means a "byte-string" is interchangeable with "binary pattern string". Moreover, the terms "byte" and "byte-string" are only used for brevity and to help describe examples in accordance with aspects of the invention below, given that the concept of a "byte" is commonly understood in the art to include a collection of bits (e.g. 8-bits) grouped together.

Referring to FIGS. 1A and 1B, provided as an illustrative example only, shown is an example of the single data tree 200 created from the data set 22, which is partially shown including only a portion of the data set 22 relevant to the data tree 20. The data tree 200 has a root node 210, storing the character "A" and symbol "65". The root node 210 has first and second child nodes 220 and 230, storing respective characters "b" and "I" with corresponding symbols "257" and "258". The first child node 220 has third and fourth child nodes 222 and 224, storing respective characters "s" and "i" with corresponding symbols "261" and "270". The second child node 230 has fifth and sixth child nodes 232 and 234, storing respective characters "i" and "t" with corresponding symbols "280" and "290". Although the root node 210, and the first and second child nodes 220 and 230 are illustrated as specifically having two child nodes each, those skilled in the art will appreciate that more generally a node serving as a parent may have any number of child nodes.

Creating a data tree (e.g. tree 200) includes parsing through a data set (e.g. data set 22) or a sample portion of the data set and identifying repetitive byte-strings. The basic process involves adding child nodes to the ends of existing byte-strings stored in data trees. Such a process starts by matching an initial character from the data set to an appropriate root node and then matching subsequent characters to child nodes until the end of the byte-string is found. A new child node is then added to the end of the byte-string, and then the next character from the data set is matched to a corresponding root node and the process repeats. In accordance with aspects of the invention, a detailed example method of how data trees are constructed is described below with reference to FIG. 2.

A symbol table includes a listing of symbols. Each symbol is unique and corresponds to a particular node in one of the collection of data trees included in a static dictionary. Moreover, each symbol corresponds to the end of a respective byte-string. A symbol table also includes a listing of pointers, where each pointer corresponds to a particular node that a respective symbol corresponds to. As already noted, a static dictionary is a finite size. Thus, it is not always possible to store all byte-strings identified in a data set. Accordingly, a static dictionary is often grown in steps that include: growing the data trees until a predetermined number of nodes or symbols is reached; evaluating which nodes (and thus byte-strings) are worth keeping; removing (i.e. pruning) the nodes determined not to be worth keeping; repeating the growth and pruning of the data trees, as described, until the entire data set or sample portion of the data set has been processed; and finally pruning the data trees down to a desired final size (i.e. number of symbols or nodes).

Turning to FIG. 1C, shown is a portion of an example of a symbol table 110 including only information relevant to the data tree 200 shown in FIG. 1A. However, those skilled in the art will appreciate that a symbol table more specifically includes symbols from one or more data trees used to define a static dictionary. For the sake of illustrating the present example only, the pointer values for each symbol correspond to the reference indicia used in FIG. 1A. For example, symbol "270" is shown as having pointer "224". Those skilled in the art will appreciate that a pointer refers to a storage location address. Moreover, also for the sake of illustrating present example only, the symbol table 110 (FIG. 1C) includes an extra "character-string field" 120 showing the byte-string implied by reference to each particular node in the symbol table 110.

For example, the symbol "270" corresponds to respective byte-string "Abi" which can be retrieved from the data tree 200 by concatenating characters encountered on a direct path from the root node 210 to the fourth child node 224. The byte-string "Abi" includes the byte-string "Ab", which can be retrieved from the data tree 200 by concatenating characters encountered on a direct path from the root node 210 to the first child node 220. Moreover, with specific reference to FIG. 1B, it is clear that the shorter byte-string "Ab" is present in the data set 22 more often than the byte-string "Abi". However, the byte-string "Abi" may provide a better compression ratio, and thus, in accordance with aspects of the invention, methods are provided that favor longer byte-strings, as opposed to the shorter byte-strings included near the beginning of the longer byte-strings. By contrast, previously known methods of building a static dictionary favor short byte-strings, such as "Ab", that have higher frequency count values than longer byte-strings, such as "Abs".

Briefly, in operation, using a static dictionary defined by a collection of data trees and a symbol table, compression is accomplished by: selecting characters from the data set; traversing the data trees until a child node is encountered that does not have any child nodes of its own; and inserting the symbol of that child node in place of a byte-string in the data set that matches a corresponding byte-string obtained in a direct path from a particular root node to the child node. On the other hand, expansion is accomplished by: parsing a compressed data set so as to identify symbols; retrieving a respective pointer for each symbol from the symbol table; and, inserting a corresponding byte-string back into the data set in place of a particular symbol, where the byte-string matches a corresponding byte-string obtained in a direct path from a particular root node to the child node.

Generally, compression ratio is defined as the size of data after compression divided by the size of the data before compression. The size of the data before and after compression is measurable in terms of bits, bytes, words frames and the like. Before a data set is compressed the size of the data includes the data set itself, whereas after a data set is compressed the size of the data includes the size of the compressed data set and the memory required to store the static dictionary. If multiple data sets can be compressed using the same static dictionary, then the compression ratio is calculated taking into account that the size of the data before compression is the sum of the sizes of the data sets, and the size of the data after compression is the sum of the sizes of the corresponding compressed data sets plus the memory required to store the static dictionary. Additionally and/or alternatively, the size of the static dictionary is not included in the calculation of compression ratio as its effect on compression is small.

Symbols can be evaluated in terms of efficiency. Efficiency of a symbol is calculated as the number of times a corresponding byte-string occurs in a data set (or portion of a data set) multiplied by the length of the byte-string.

Figure 2:
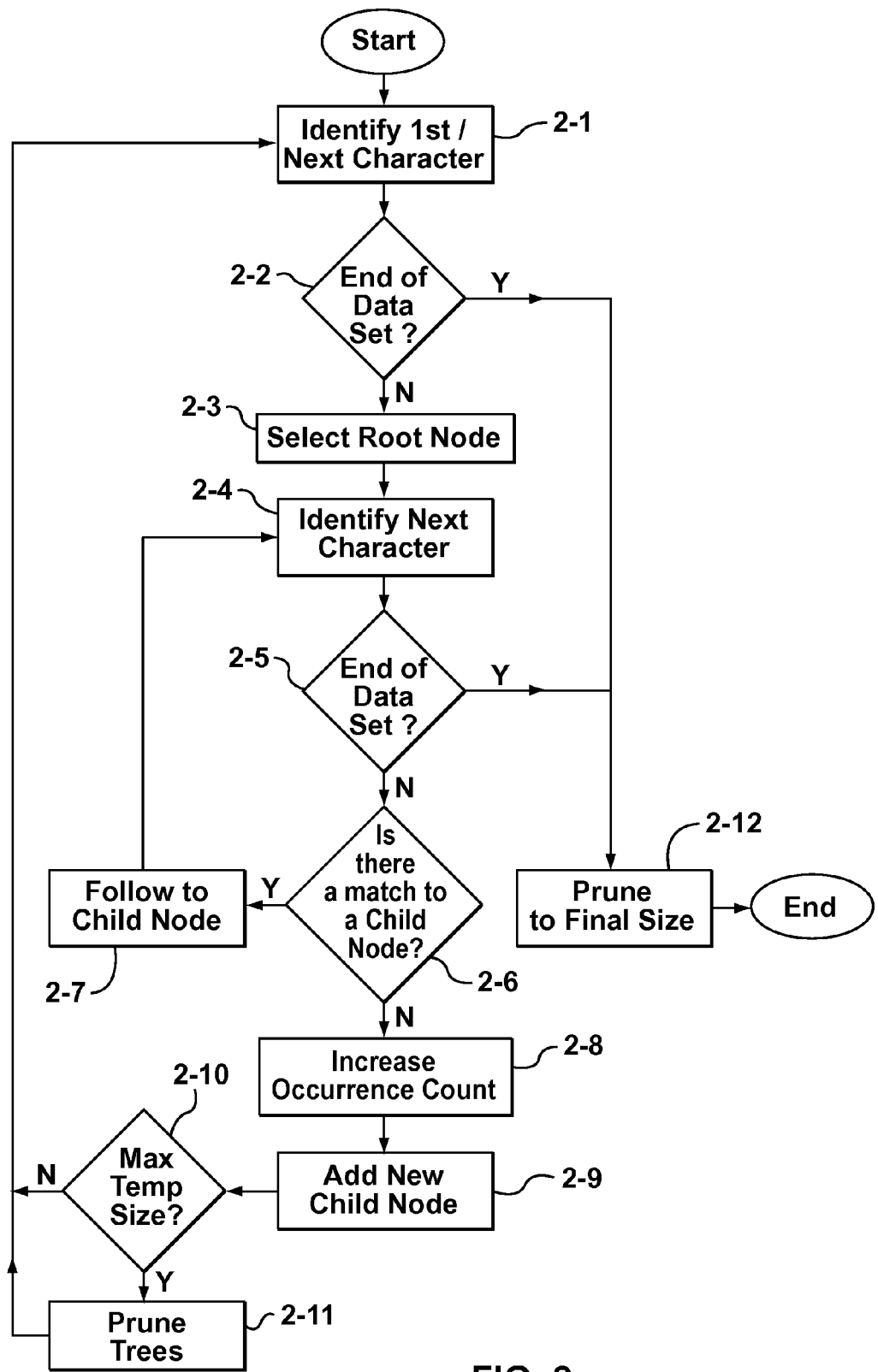
FIG. 2 is a flow chart illustrating a first method of building a collection of data trees and simultaneously tabulating occurrence count values in accordance with aspects of the invention.

Referring to FIG. 2, shown is a flow chart illustrating a first method of building a collection of data trees and simultaneously tabulating occurrence count values in accordance with aspects of the invention. For a given data set containing text characters (e.g. from the Extended ASCII Character Set), at step 2-1, the first method includes identifying the first/next character in the data set. More specifically, the method starts by identifying the first character in the data set, and subsequently identifying a next character when the method loops back to step 2-1 as described as follows.

At step 2-2, the method includes determining whether or not the character identified at step 2-1—whether it be the first or a next character—is a character and/or signal value indicating that the end of the data set has been reached (i.e. has the end of file marker been retrieved). If the end of the data set has been reached (yes path, step 2-2), then the method proceeds to step 2-12, which is described in greater detail below. On the other hand if the end of the data set has not been reached (no path, step 2-2), then the method proceeds to step 2-3 that includes selecting a respective root node. For example, as described above 256 different root nodes may be provided, where each root node corresponds to one of the characters included in the Extended ASCII Character Set.

Subsequently, at step 2-4, the method includes identifying the next character in the data set, and at step 2-5, determining whether or not the character identified at step 2-4 is a character and/or signal value indicating that the end of the data set has been reached. If the end of the data set has been reached (yes path, step 2-5), then the method proceeds to step 2-12, which is described in greater detail below. On the other hand, if the end of the data set has not been reached (no path, step 2-5), then the method proceeds to step 2-6.

At step 2-6, the method includes determining whether or not the current node—whether it is a root node or a child node—has a child node already storing the character identified at step 2-4. If there is a child node storing the character identified at step 2-4 (yes path, step 2-6), the method proceeds to step 2-7, where the method follows a respective branch to the identified child node before looping back to step 2-4. On the other hand, if the current node does not have a child node storing the character identified at step 2-4 (no path, step 2-6), the method proceeds to step 2-8.

At step 2-8, the method includes increasing the occurrence count for the current node, thereby indicating that the current node is the end of a byte-string that has been visited at least twice and serves as a parent to at least one child node. Subsequently, at step 2-9, the method includes adding a new child node to the current node, thereby making the current node a parent node to at least one child node. The newly added child node stores the character identified at step 2-4.

Step 2-10 of the method includes determining whether or not the current size of the static dictionary is at a predetermined temporary maximum size. If the current size of the static dictionary is not the predetermined temporary maximum size (no path, step 2-10), then the method loops back to step 2-1. On the other hand, if the current size of the static dictionary is the predetermined temporary maximum size (yes path, step 2-10), then the method proceeds to step 2-11 before looping back to step 2-1.

At step 2-11, the method includes pruning the size of static dictionary down to a predetermined temporary pruned value.

The method comes to an end after step 2-12. At step 2-12, the static dictionary is reduced (i.e. pruned) down to the desired final size.

In accordance with some aspects of the invention, reducing the size of the static dictionary (i.e. pruning) involves identifying the symbols with the low efficiency and removing them, while preserving the symbols with the high efficiency values. In accordance with some aspects of the invention, efficiency for a symbol is determined by the combination of the respective occurrence count for the symbol and the number of characters in the byte-string represented by the symbol. In accordance with other aspects of the invention, reducing the size of the static dictionary (i.e. pruning) involves identifying the symbols with low occurrence count values and removing them, while preserving the symbols with high occurrence count values.

In some embodiments the predetermined temporary maximum size is a multiple of the desired final size of the static dictionary. For example, the predetermined temporary maximum size may be 8 times the desired final size of the static dictionary. In other embodiments desired final size may be specified in terms of a number of symbols and/or a number of nodes. For example, the desired final size may be specified being 4096 symbols and the predetermined temporary maximum size would then be 32,768 symbols if 8 is the multiple used. Moreover, if 4096 symbols is the desired final size, 12 bits can be used to represent all the symbols in the set of 4096 symbols. In other embodiments, the desired final size may be specified in terms of a specified amount of memory.

Similarly, in some embodiments, the predetermined temporary pruned sized size is also a multiple of the desired final size of the static dictionary. For example, the predetermined temporary pruned size may be 4 times the desired final size of the static dictionary.

Figure 3A:
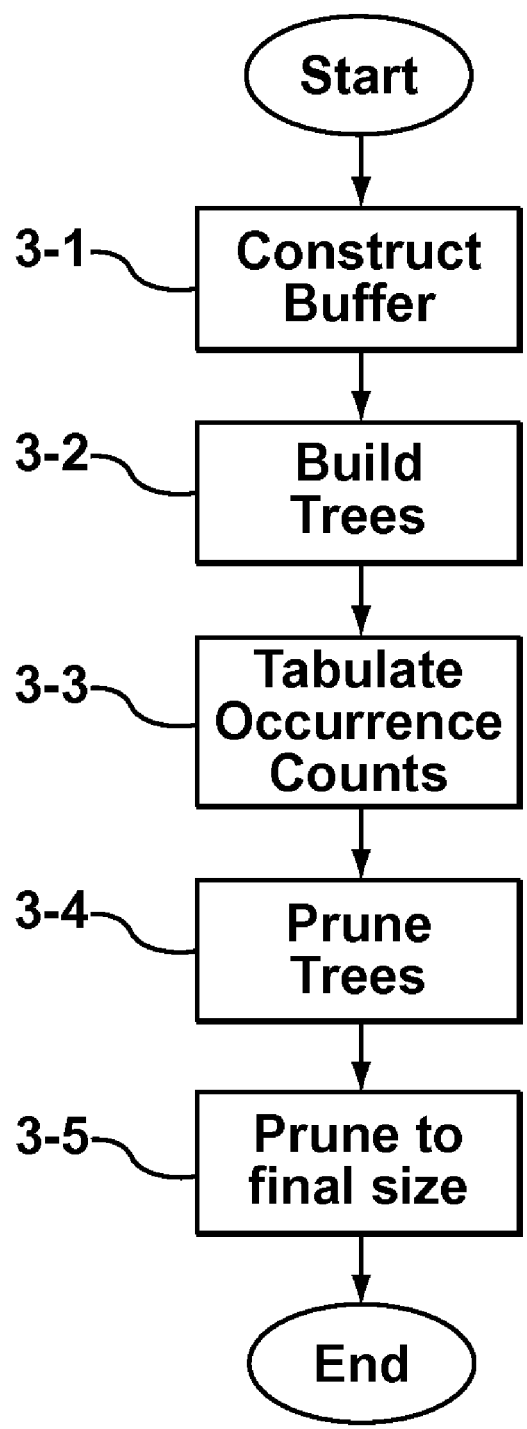
FIG. 3A is a flow chart illustrating a second method of building a collection of data trees and tabulating occurrence count values in accordance with aspects of the invention.
Figure 3B:
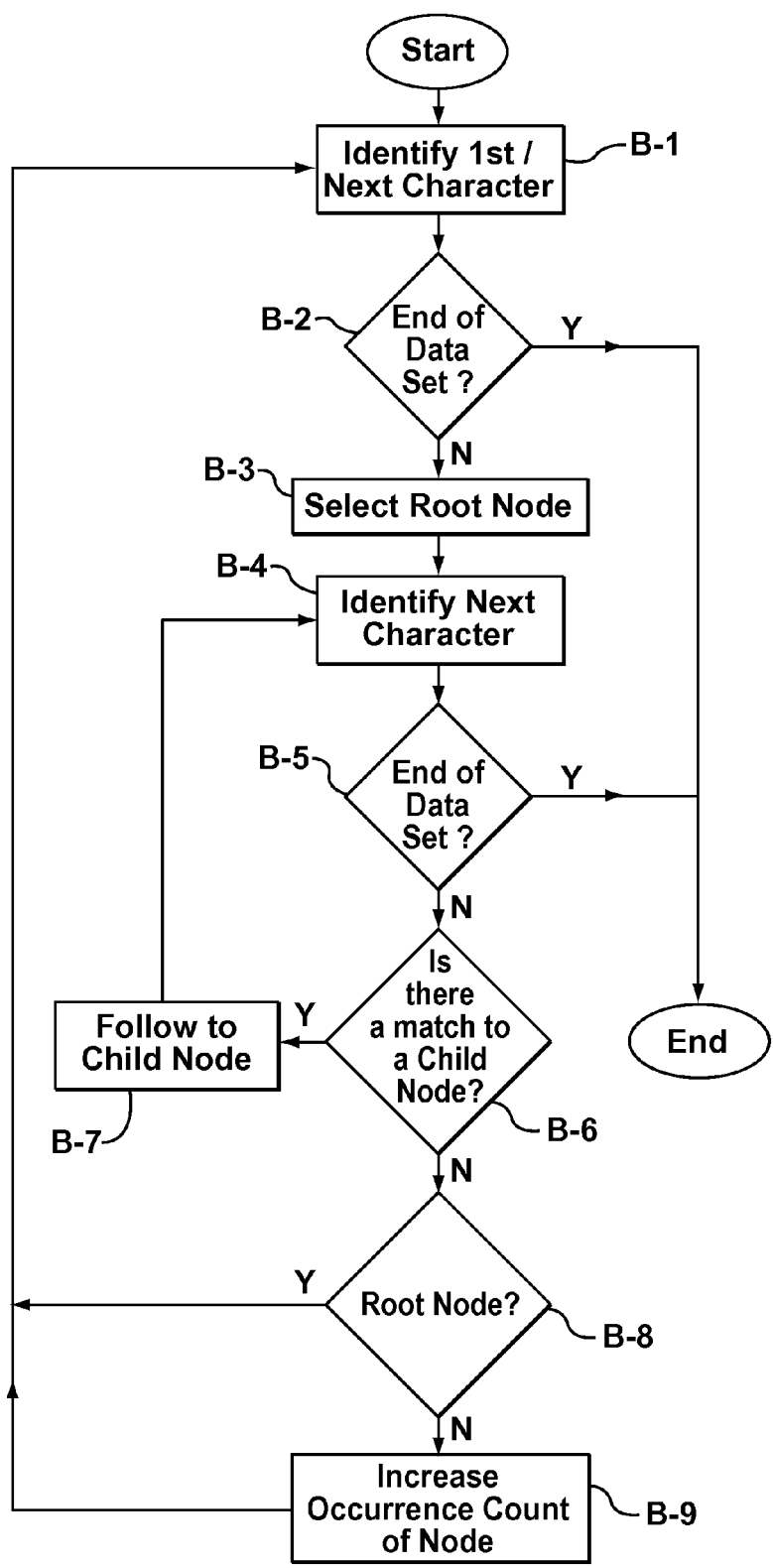
FIG. 3B is a flow chart illustrating the specific steps for tabulating occurrence count values in FIG. 3A, after at least a portion of the data trees have been created, in accordance with aspects of the invention.

FIGS. 3A and 3B illustrate a second method of building a collection of data trees (i.e. a trie) and tabulating occurrence count values after at least a portion of the data trees have been created in accordance with aspects of the invention.

With specific reference to FIG. 3A, for a given data set containing text characters (e.g. from the Extended ASCII Character Set), starting at step 3-1, the second method includes loading a buffer with a portion of the data set. More specifically, it is preferable to load the buffer with a sample of the data set that has been deliberately constructed to be representative of the content of the data set. Again, it should be noted that the static dictionary is created in phases that include sequential steps of growing and pruning the static dictionary until a representative sample portion of the data set is processed or the entire data set is processed.

A static dictionary is a representation of the most frequently used sample of the input data. If the dictionary size is fixed at 4096 symbols, for instance, it does not usually matter whether 1,000 MB or 1,000,000 MB of data is processed. Hence, in accordance with some aspects of the invention, a static dictionary can be built from either an entire data set or just a sample of the data set loaded into a buffer. One advantage of using just a sample of the data set is that less data is processed, hence, the process is faster. Secondly, the buffer may be used to get accurate occurrence count values by sample compression. In order for the sample to have no bias, it preferable that the sample is uniformly representative of the whole data set.

At step 3-2, the method includes building a portion of a static dictionary as described above (with or without simultaneously tabulating respective occurrence count values for corresponding byte-strings) using the portion of the data set in the buffer. If the occurrence count values are tabulated while the portion of the static dictionary is being grown/built, all the occurrence count values are set to zero (or some other base value) before step 3-3. Step 3-3 includes tabulating the occurrence count values by performing a pseudo-matching step to identify the longest and most frequently occurring byte-strings. An exemplary method for tabulating the occurrence count values by performing a pseudo-matching step to identify the longest and most frequently occurring byte-strings is described below with reference to FIG. 3B.

Step 3-4 of the method includes pruning the static dictionary, as described above, down to a predetermined temporary pruned size. At step 3-5, the method includes pruning the static dictionary down to a desired final size. Then the second method ends.

Turing to FIG. 3B, starting at step B-1, the method includes identifying the first/next character in the buffer. More specifically, the method starts by identifying the first character in the buffer, and subsequently identifying a next character when the method loops back to step B-1 as described as follows.

At step B-2, the method includes determining whether or not the character identified at step B-1—whether it be the first or a next character—is a character and/or signal value indicating that the end of the buffer has been reached. If the end of the buffer has been reached (yes path, step B-2), then this portion of the method ends, and the method resumes at step 3-4 as described above with reference to FIG. 3A. On the other hand if the end of the buffer has not been reached (no path, step B-2), then the method proceeds to step B-3 that includes selecting a respective root node. For example, as described above 256 different root nodes may be provided, where each root node corresponds to one of the characters included in the Extended ASCII Character Set.

Subsequently, at step B-4, the method includes identifying the next character in the buffer, and at step B-5, determining whether or not the character identified at step B-4 is a character and/or signal value indicating that the end of the data set has been reached. If the end of the buffer has been reached (yes path, step B-5), then this portion of the method ends as described in the previous paragraph. On the other hand if the end of the data set has not been reached (no path, step B-5), then the method proceeds to step B-6.

At step B-6, the method includes determining whether or not the current node—whether it is a root node or a child node—has a child node already storing the character identified at step B-4. If there is a child node storing the character identified at step B-4 (yes path, step B-6), the method proceeds to step B-7, where the method follows a respective branch to the identified child node before looping back to step B-4. On the other hand, if the current node does not have a child node storing the character identified at step B-4 (no path, step B-6), the method proceeds to step B-8.

At step B-8, the method includes determining whether or not the current node is a root node. If the current node is not a root node (no path, step B-8), then the method proceeds to step B-9 that includes incrementing the occurrence count for the current node. On the other hand, if the current node is a root node (yes path, step B-8), the method loops back to step B-1.

Figures 4B, 4C:
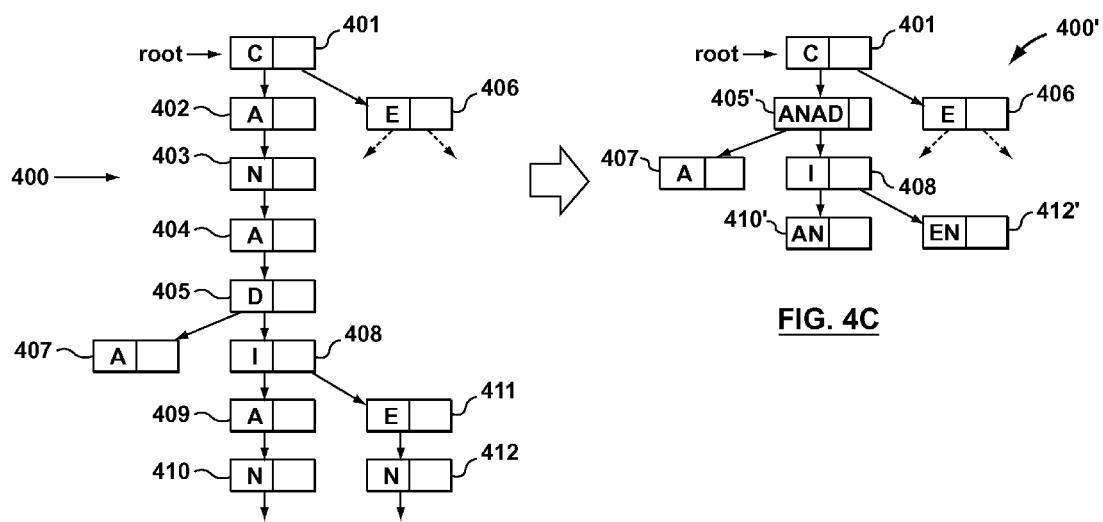
FIG. 4B is a block diagram illustration of an example data tree before the third method illustrated in the flow chart of FIG. 4A is applied.
FIG. 4C is a block diagram illustration of an example data tree after the third method illustrated in the flow chart of FIG. 4A is applied.
Figure 4A:
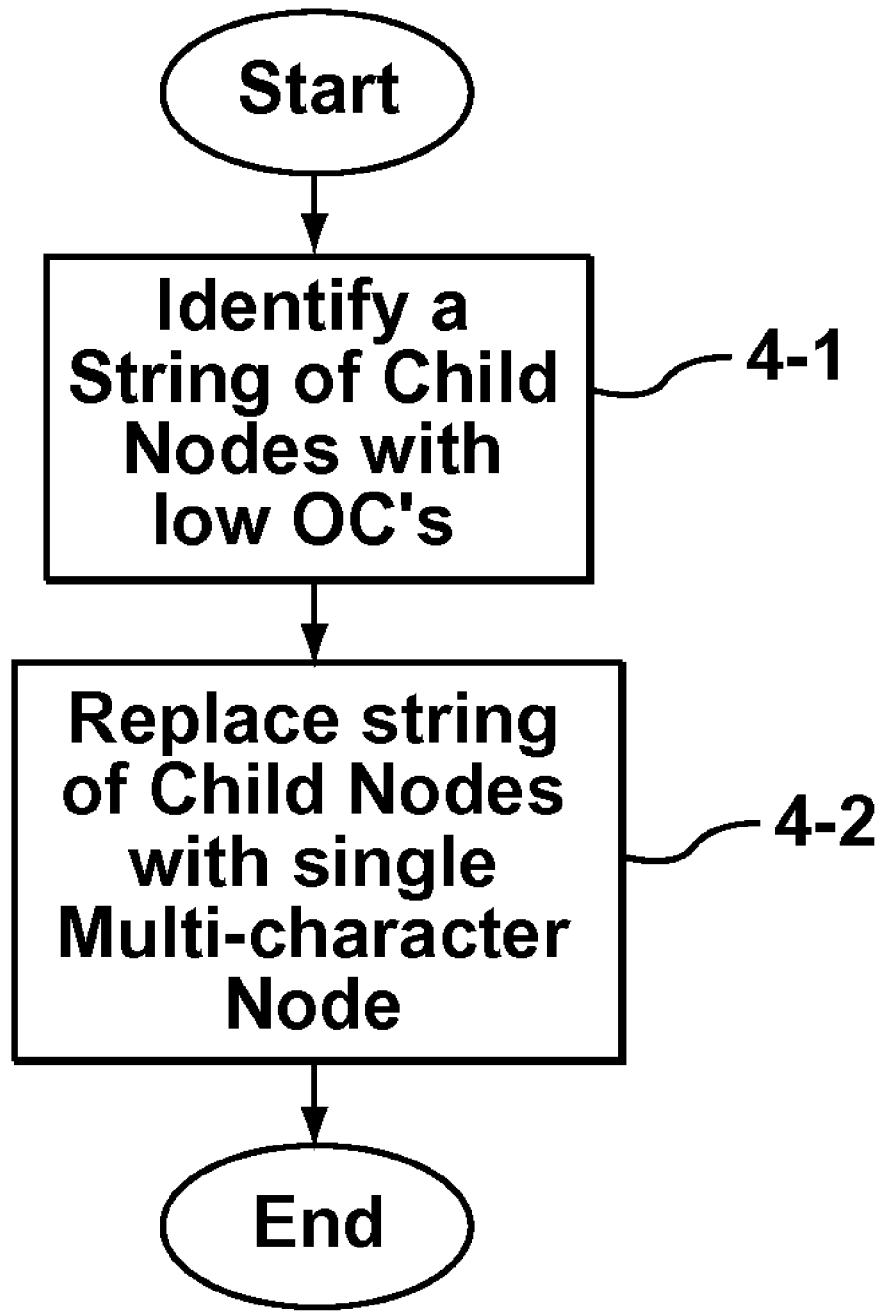
FIG. 4A is a flow chart illustrating a third method of reducing a non-branching sequential string of nodes into a single node in accordance with aspects of the invention.

Referring to FIG. 4A, shown is a simple flow chart illustrating a third method of reducing a non-branching sequential string of nodes into a single node in accordance with aspects of the invention. Additionally, FIGS. 4B and 4C, show respective block diagram illustrations of an example data tree 400 and 400' respectively before and after the method illustrated in the flow chart of FIG. 4A is applied.

With specific reference to FIG. 4A, starting at step 4-1, the method includes identifying a non-branching sequential string of child nodes with low occurrence count values (i.e. OC's, as illustrated in FIG. 4A). Step 4-2 includes replacing the non-branching sequential string of child nodes with a single child node storing the corresponding characters from the non-branching sequential string of nodes.

Turning to FIG. 4B, the data tree 400 is illustrated as it would conceptually exist before the method illustrated in FIG. 4A is applied. The data tree includes a root node 401, a non-branching sequential string of child nodes 402, 403, 404 and 405 extending from the root node 401 and another child node 406 also extending from the root node 401. The last child node 405 in the non-branching sequential string of child nodes has child nodes 407 and 408. The child node 408 has two non-branching sequential strings of child nodes 409, 410 and 411, 412, respectively.

A first byte-string represented by the child node 407 is "CANADA", whereas a second byte-string represented by the child node 410 is "CANADIAN" and a third byte-string represented by the child node 412 is "CANADIEN". Each of the first, second and third byte-strings shares a fourth common byte-string "ANAD" represented by the child node 405 without including the root node 401. Presumably, the fourth byte-string, which includes the non-branching sequential string of child nodes 402, 403, 404 and 405, would not have a high occurrence count as tabulated in accordance with aspects of the invention (as described for example in the specific examples above), since the fourth byte-string is simply a portion of the first, second and third byte-strings. Similarly, fifth and sixth byte-strings "AN" and "EN" between node 408 and nodes 410 and 412, respectively, would also not have high occurrence count values. Accordingly, when the method illustrated in FIG. 4A is applied to the data tree 400 the result is the data tree 400', which represents the same byte-strings described above.

More specifically, with specific reference to FIG. 4C, the data tree 400' also includes the root node 401 and the child node 406 as shown in FIG. 4B. However, instead of the non-branching sequential string of child nodes 402, 403, 404 and 405, the data tree 400' includes a multi-character node 405' storing the sequence of characters in the fourth byte-string "ANAD". Similarly, the fifth and sixth byte-strings "AN" and "EN" are now stored in corresponding multi-character nodes 410' and 412', respectively.

Figure 5:
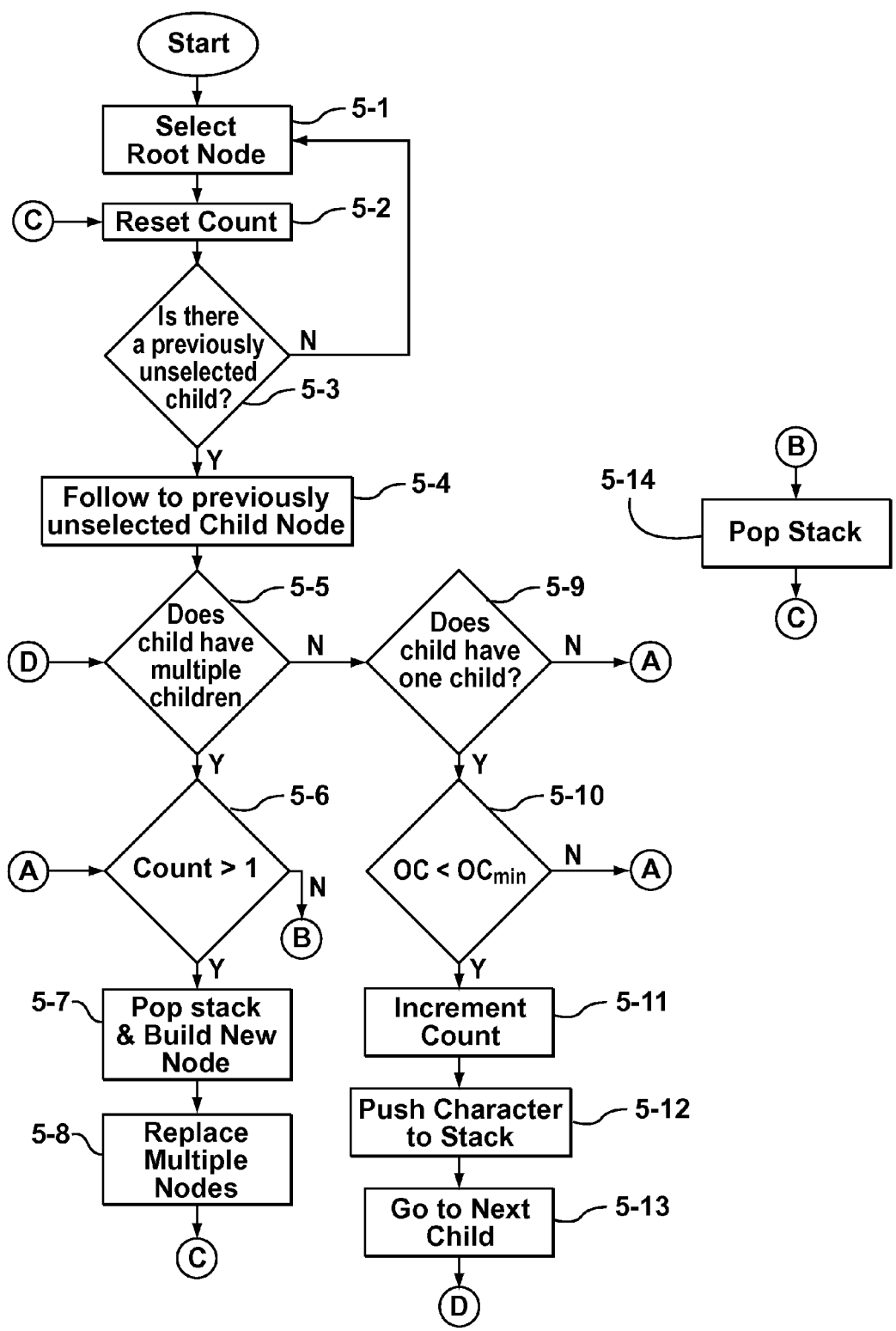
FIG. 5 is a flow chart illustrating a fourth method of reducing a non-branching sequential string of nodes into a single node in accordance with aspects of the invention.

Provided as an example, FIG. 5 shows a flow chart illustrating a fourth method of reducing a non-branching sequential string of nodes into a single node in accordance with aspects of the invention. Given a static dictionary with a collection of data trees having nodes with respective occurrence count values, starting at step 5-1, the method includes selecting a root node. At step 5-2, the method includes resetting a count value to zero. The count value represents the number of characters pushed on to a stack. Step 5-3 of the method includes determining whether or not the root selected at step 5-1 has any previously unselected child nodes. If the selected root node does not have any previously unselected child nodes (no path, step 5-3), then the method loops back to step 5-1. On the other hand, if the selected root node does have a previously unselected child node (yes path, step 5-3), then the method proceeds to step 5-4 that includes following the data tree to a previously unselected child node.

Step 5-5 of the method includes determining whether or not the child node is a parent node to multiple child nodes. If the child node is a parent to multiple child nodes (yes path, step 5-5), then the method proceeds to step 5-6. On the other hand, if the child node is not a parent to multiple child nodes (no path, step 5-5), then the method proceeds to step 5-9, which is described in detail further below.

At step 5-6 the method includes determining whether or not more than one character has been pushed onto the stack (i.e. is count>1). If more than one character has been pushed onto the stack (yes path, step 5-6), then the method proceeds to step 5-7. On the other hand, if less that two characters have been pushed onto the stack (no path, step 5-6), then the method proceeds to step 5-14 which is described in detail further below.

Step 5-7 of the method includes popping the characters on the stack and building a corresponding multi-character node. Subsequently, at step 5-8, the method includes replacing a respective non-branching sequential string of child nodes (e.g. child nodes 402, 403, 404 and 405 in FIG. 4B) with the multi-character node (e.g. 405') built at step 5-7, before looping back to step 5-2.

As noted above Step 5-9 follows from the step 5-5. At step 5-9, the method includes determining whether or not the child node selected at step 5-4 has one child node. If the child node does not have a child node (no path, step 5-9), the method follows to step 5-6 described above. On the other hand, if the child node has a single child node (yes path, step 5-9) the method proceeds to step 5-10.

At step 5-10, the method includes determining whether or not the child node selected at step 5-4 has a respective occurrence count value (OC) less than a minimum occurrence count threshold value ($OC_{min}$). If the respective occurrence count value is not less than a minimum occurrence count threshold value (no path, step 5-10), then the method follows to step 5-6 described above. If the respective occurrence count value is less than a minimum occurrence count threshold value (yes path, step 5-10), then the method proceeds to step 5-11.

Step 5-11 includes incrementing the count value to reflect the number of characters pushed to the stack. Step 5-12 includes pushing the character stored in the child node selected at step 5-4 onto the stack before going to the next child at step 5-13. Following step 5-13, the method follows back to step 5-5 described above.

At step 5-14, the method includes popping the stack without building a node before looping back to step 5-2.

While the above description provides example embodiments, it will be appreciated that the present invention is susceptible to modification and change without departing from the fair meaning and scope of the accompanying claims. Accordingly, what has been described is merely illustrative of the application of aspects of embodiments of the invention and numerous modifications and variations of the present invention are possible in light of the above teachings.

What is claimed is:

1. A method for creating a static dictionary, the method comprising:

providing a plurality of data trees, each of the plurality of data trees comprising a root node, at least one of the plurality of data trees comprising at least one child node, wherein each root node and each child node stores an associated binary pattern, wherein each child node is adapted to store a symbol associated with the child node and an occurrence count value associated with the child node;

defining a binary pattern string, the binary pattern string comprising a concatenation of the binary patterns in a direct path from the root node to a particular child node, and wherein an occurrence count value for the binary pattern string is the occurrence count value of the particular child node;

incrementing the occurrence count value of the binary pattern string when the particular child node is visited; and storing the respective unique symbols and corresponding pointers to particular child nodes in a symbol table.

2. A method for creating a static dictionary, the method comprising:

providing a plurality of data trees, each of the plurality of data trees comprising a root node, at least one of the plurality of data trees comprising at least one child node, wherein each root node and each child node stores an associated binary pattern, wherein each child node is adapted to store a symbol associated with the child node and an occurrence count value associated with the child node;

defining a binary pattern string, the binary pattern string comprising a concatenation of the binary patterns in a direct path from the root node to a particular child node, and wherein an occurrence count value for the binary pattern string is the occurrence count value of the particular child node;

incrementing the occurrence count value of the binary pattern string when the particular child node is visited;

adding child nodes to the plurality of data trees until the combined size of the plurality of the data trees is a predetermined temporary maximum size; and removing binary pattern strings using an evaluation of occurrence count values so as to reduce the combined size of the plurality of data trees down to a predetermined size.

3. The method according to claim 2, wherein incrementing the occurrence count value of a particular child node occurs only when the particular child node becomes a parent node to a new child node added to the static dictionary.

4. The method according to claim 2, wherein incrementing the occurrence count value of a particular child node occurs only when the particular child node is visited and the particular child node does not serve as a parent node to any other child nodes.

5. The method according to claim 2, wherein the predetermined size is one of a predetermined temporary pruned size and a predetermined desired final size.

6. The method according to claim 2, wherein removing binary pattern strings using an evaluation of occurrence count values comprises:

identifying binary pattern strings with low occurrence count values; and deleting at least some of the child nodes included in the binary pattern string.

7. The method according to claim 2, wherein removing binary pattern strings using an evaluation of occurrence count values comprises:

identifying binary pattern strings with low efficiency values, wherein the efficiency value of a binary string is the occurrence count of the binary pattern string multiplied by the length of the binary pattern string; and deleting at least some of the child nodes included in the binary pattern string.

8. The method according to claim 2 further comprising:

constructing a sample of the data set using the representative of the content of the data set;

storing the sample in a buffer; and performing a sample compression by matching binary pattern strings in the buffer to binary pattern strings in the static dictionary to determine the occurrence count values of binary string patterns in the static dictionary.

9. The method according to claim 2 further comprising:

identifying a non-branching sequential string of child nodes with low occurrence count values; and replacing the non-branching sequential string of child nodes with a single child node storing the corresponding binary patterns from the non-branching sequential string of nodes.

10. A system for creating a static dictionary, comprising:

an element for providing a plurality of data trees, each of the plurality of data trees comprising a root node, at least one of the plurality of data trees comprising at least one child node, wherein each root node and each child node stores an associated binary pattern, wherein each child node is adapted to store a symbol associated with the child node and an occurrence count value associated with the child node;

an element for defining a binary pattern string, the binary pattern string comprising a concatenation of the binary patterns in a direct path from the root node to a particular child node, and wherein an occurrence count value for the binary pattern string is the occurrence count value of the particular child node;

an element for incrementing the occurrence count value of the binary pattern string when the particular child node is visited; and an element for storing the respective unique symbols and corresponding pointers to particular child nodes in a symbol table.

11. A system for creating a static dictionary, comprising:

an element for providing a plurality of data trees, each of the plurality of data trees comprising a root node, at least one of the plurality of data trees comprising at least one child node, wherein each root node and each child node stores an associated binary pattern, wherein each child node is adapted to store a symbol associated with the child node and an occurrence count value associated with the child node;

an element for defining a binary pattern string, the binary pattern string comprising a concatenation of the binary patterns in a direct path from the root node to a particular child node, and wherein an occurrence count value for the binary pattern string is the occurrence count value of the particular child node; and an element for incrementing the occurrence count value of the binary pattern string when the particular child node is visited;

an element for adding child nodes to the plurality of data trees until the combined size of the plurality of the data trees is a predetermined temporary maximum size; and an element for removing binary pattern strings using an evaluation of occurrence count values so as to reduce the combined size of the plurality of data trees down to a predetermined size.

12. A computer program product comprising a computer usable medium including computer usable program code for creating a static dictionary for use in lossless data compression and expansion, the computer program product including:

computer usable program code for providing a plurality of data trees, each of the plurality of data trees comprising a root node, at least one of the plurality of data trees comprising at least one child node, wherein each root node and each child node stores an associated binary pattern, wherein each child node is adapted to store a symbol associated with the child node and an occurrence count value associated with the child node;

computer usable program code for defining a binary pattern string, the binary pattern string comprising a concatenation of the binary patterns in a direct path from the root node to a particular child node, and wherein an occurrence count value for the binary pattern string is the occurrence count value of the particular child node;

computer usable program code for incrementing the occurrence count value of the binary pattern string when the particular child node is visited; and computer usable program code for storing the respective unique symbols and corresponding pointers to particular child nodes in a symbol table.

13. The computer program product according to claim 12, further including:

computer usable program code for adding child nodes to the plurality of data trees until the combined size of the plurality of the data trees is a predetermined temporary maximum size; and computer usable program code for removing binary pattern strings using an evaluation of occurrence count values so as to reduce the combined size of the plurality of data trees down to a predetermined size.

14. The computer program product according to claim 13, further including computer usable program code for incrementing the occurrence count value of a particular child node occurs only when the particular child node becomes a parent node to a new child node added to the static dictionary.

15. The computer program product according to claim 12, further including:

computer usable program code for constructing a sample of the data set using the representative of the content of the data set;

computer usable program code for storing the sample in a buffer; and computer usable program code for performing a sample compression by matching binary pattern strings in the buffer to binary pattern strings in the static dictionary to determine the occurrence count values of binary string patterns in the static dictionary.

16. The computer program product according to claim 15, wherein incrementing the occurrence count value of a particular child node occurs only when the particular child node is visited during the sample compression for tabulating occurrence count values and the particular child node does not serve as a parent node to any other child nodes.

17. The computer program product according to claim 12, further including:

computer usable program code for identifying a non-branching sequential string of child nodes with low occurrence count values; and computer usable program code for replacing the non-branching sequential string of child nodes with a single child node storing the corresponding binary patterns from the non-branching sequential string of nodes.

* * * * *